(12) United States Patent
Wu et al.

(10) Patent No.: US 7,864,912 B1
(45) Date of Patent: *Jan. 4, 2011

(54) CIRCUITS, ARCHITECTURES, A SYSTEM AND METHODS FOR IMPROVED CLOCK DATA RECOVERY

(75) Inventors: Lei Wu, Sunnyvale, CA (US); Henri Sutioso, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 266 days.

This patent is subject to a terminal disclaimer.

(21) Appl. No.: 11/975,495

(22) Filed: Oct. 19, 2007

(51) Int. Cl.
*H03D 3/24* (2006.01)
(52) U.S. Cl. ...................................... 375/375
(58) Field of Classification Search .................. None
See application file for complete search history.

(56) References Cited

U.S. PATENT DOCUMENTS

| | | | |
|---|---|---|---|
| 4,590,602 A * | 5/1986 | Wolaver | 375/375 |
| 4,773,085 A * | 9/1988 | Cordell | 375/375 |
| 5,812,618 A | 9/1998 | Muntz et al. | |
| 6,031,428 A | 2/2000 | Hill | |
| RE36,633 E | 3/2000 | Fleischer et al. | |
| 6,055,286 A * | 4/2000 | Wu et al. | 375/375 |
| 6,081,572 A | 6/2000 | Filip | |
| 6,178,215 B1 | 1/2001 | Zhang et al. | |
| 6,400,683 B1 | 6/2002 | Jay et al. | |
| 6,531,926 B1 | 3/2003 | Pate et al. | |
| 6,731,709 B2 | 5/2004 | Doblar | |
| 6,734,748 B2 * | 5/2004 | Livezey | 331/158 |
| 2002/0044618 A1 * | 4/2002 | Buchwald et al. | 375/355 |

FOREIGN PATENT DOCUMENTS

EP 0 876 016 A1 11/1998

OTHER PUBLICATIONS

Serial ATA Host Controller Solutions 88SX5080 information sheet, from www.marvell.com, Marvell Int'l.
Serial ATA Bridge Chip Solutions 88i8030 information sheet, from www.marvell.com, Marvell Int'l.

* cited by examiner

*Primary Examiner*—Khanh C Tran

(57) ABSTRACT

Circuits, architectures, a system and methods for clock data recovery. The circuit generally includes a clock phase adjustment circuit, receiving clock phase information and providing a clock phase adjustment signal, a clock frequency adjustment circuit, receiving clock frequency information and providing a clock frequency adjustment signal, and an adder circuit, receiving the clock phase adjustment signal and the clock frequency adjustment signal, and providing a clock recovery adjustment signal. The architectures and/or systems generally comprise those that include a clock data recovery circuit embodying one or more of the inventive concepts disclosed herein. The method generally comprises the steps of sampling the data stream at predetermined times, generating clock frequency information and clock phase information from sampled data, and altering a frequency and/or a phase of the clock signal in response to the clock frequency information and the clock phase information. The present invention prevents or reduces the likelihood of a potential nonconvergence/clock runaway problem, advantageously with minimal or no changes to existing designs and logic. The present invention further advantageously improves system stability, reliability and performance with a minimum of additional circuitry.

32 Claims, 8 Drawing Sheets

If $e_1 \neq c_1 \rightarrow$ dn
If $c_1 \neq e_2 \rightarrow$ up

If $e_2 = c_2 = e_3$ AND $c_1 \neq e_2$ AND $e_3 \neq c_3 \rightarrow$ dnf

If $e_2 \neq c_2$ AND $c_2 \neq e_3 \rightarrow$ upf

CIRCUITS, ARCHITECTURES, A SYSTEM AND METHODS FOR IMPROVED CLOCK DATA RECOVERY

RELATED APPLICATIONS

This application is a continuation of U.S. application Ser. No. 10/619,278, filed Jul. 14, 2003, incorporated herein by reference.

FIELD OF THE INVENTION

The present invention generally relates to the field of clock data recovery. More specifically, embodiments of the present invention pertain to circuitry, architectures, systems and methods for recovering a high frequency clock signal from a data stream.

DISCUSSION OF THE BACKGROUND

FIG. 1 shows a conventional physical layer transceiver 10 (or PHY device), configured to operate in a storage network. Transceiver 10 generally comprises a transmitter 20, a receiver 30, a digital timing loop 40 and a finite state machine 50. Digital timing loop 40 receives a digital receiver clock signal RXCLK from receiver 30 and (optionally) a digital transmitter clock signal TXCLK from transmitter 20, and outputs multi-bit adjustment/control signals TXDPHER and RXDPHER to transmitter 20 and receiver 30, respectively. In one embodiment, digital clock signal TXCLK has a frequency about double that of digital clock signal RXCLK. Digital timing loop 40 also receives a control signal CNTRL from finite state machine 50, and provides an active "phase locked" status signal PHLOCK to finite state machine 50 under appropriate conditions. Digital timing loop 40 functions to keep timing signals in the receiver 30 locked to and in phase with an appropriate reference signal. Finite state machine 50 also functions to reset transmitter 20 and receiver 30 on power up and to reset digital timing loop 40 under appropriate conditions.

In one application, transmitter 20 transmits a serial data stream generated from a coupled storage device to a network, and receiver 30 receives a serial data stream from the network for subsequent processing (e.g., conversion to a parallel data stream and storage in the coupled storage device). Transmitter 20 and receiver 30 also receive an internal reference clock signal from a phase locked loop (PLL) on the PHY device (see PLL 114 in FIG. 2) for generating the respective digital transmitter and receiver clock signals that control data transfer and processing functions.

Referring now to FIG. 2, one function of a PLL 114 is to generate one or more periodic signals, which may have multiple phases. Furthermore, functions of clock data recovery (CDR) circuitry include (i) selecting an appropriate phase of a periodic signal (or "clock") from the PLL to lock to the incoming data stream and (ii) generating or producing a recovered clock from the phase-locked PLL clock. Thus, CDR circuitry may provide a number of control and/or status signals to digital timing loop 40, including signals UP and DN, which instruct the digital timing loop 40 to speed up or slow down the recovered clock.

One approach to locking a recovered clock to a reference clock is shown in FIGS. 2 and 3. FIG. 2 shows clock adjustment circuitry 100 within the digital timing loop 40 of FIG. 1. CDR circuitry 100 generally comprises phase adjustment circuitry 104 and first integrator 106. A "receiver loop" comprises the summed output from phase adjustment circuitry 104 and integrator 106 in digital timing loop 40, and a first interpolator or reference clock phase selection circuit 116 and a phase detector block 102 in receiver 30. Integrator 106 feeds a multi-bit phase error correction signal RXDPHER to interpolator 116, which selects an appropriate phase of a multi-phase reference clock to input into phase detector block 102 in receiver 30. Phase detector block 102 also generates the signals UP and DN. In one embodiment, phase detector block 102 comprises four parallel phase detectors, each of which outputs separate UP and DN signals (see FIG. 1) that are then input into appropriate logic (e.g., "majority vote" logic) to determine the state of the up/dn signal input into phase adjustment circuitry 104.

In the diagram of FIG. 2, the recovered clock signal RXCLK is produced by receiver 30. Phase detector 102 in receiver 30 receives a serial data stream RX from an external source in the network, and passes a received data signal RXD to data processing circuitry in the PHY device. Phase detector 102 also provides clock signal RXCLK recovered from the serial data stream. Clock adjustment circuitry 100 is configured to correct phase error or phase offset in the recovered clock RXCLK. PLL 114, which receives a reference frequency from an external crystal oscillator XTL, provides a "master" or reference clock signal to receiver 30 and transmitter 20, from which the respective multi-phase reference clocks are generated. Phase error correction signal RXDPHER is fed into a multiplexer in interpolator 116 to select an appropriate phase of the PLL reference clock for input into phase detector 102. When the incoming data transmission rate is the same as the reference clock signal and the clock data recovery circuitry is in equilibrium, then the value of phase error correction signal RXDPHER remains constant, the same phase of the PLL reference clock is continuously selected, and the PLL reference clock is phase locked to the incoming data. If the incoming data transmission rate changes, the phase detector will detect an offset between the incoming data stream and the selected PLL reference clock, the value(s) of phase error correction signal RXDPHER will change, and a different phase of the PLL reference clock will be selected to adjust it closer to or into alignment with the phase of the incoming data signal.

FIG. 3A is a simplified diagram of conventional phase adjustment circuitry 104 in the clock adjustment circuitry of FIG. 2. A phase adjustment control signal up/dn is output from receiver phase detector 102 (or, alternatively, UP/DN logic in clock adjustment circuitry 100). In one embodiment, phase adjustment control signal up/dn is a three-level signal (i.e., having +1, 0, and −1 states). Phase adjustment circuit 104 comprises a phase adjustment path 120 and a phase-frequency adjustment path 122 parallel thereto, both of which receive the phase adjustment control signal up/dn. Phase adjustment path 120 generally comprises a multiplier 130, and phase-frequency adjustment path 122 generally comprises a multiplier 132 and an integrator 134. Multiplier 130 also receives a phase adjustment coefficient $\mu_p$, and multiplier 132 receives a phase-frequency adjustment coefficient $\mu_f$. These coefficients are essentially bias signals generated by conventional bias generator circuitry in accordance with predetermined design criteria, applied to multipliers 130 and 132 to provide predetermined and/or controlled effects on the phase adjustment of the recovered clock signal RXCLK. The outputs of the two adjustment paths are summed by adder 136.

FIG. 3B shows a data waveform and set of equations for illustrating the operation of the clock phase adjustment circuitry of FIG. 3A. In FIG. 3B, symbols "$e_x$" and "$c_x$" represent transitions of certain defined phases of the PLL reference clock (also see FIG. 6 and the corresponding description below). The edge, or "e," reference clock is designed to have transitions that generally coincide with transitions in the data stream, and the center, or "c," reference clock is designed to have transitions that occur during excursions or voltage level swings representing binary logic values in the individual data bits.

The up/dn signal (or alternatively, an UP and/or DN signal) is generated by sampling and comparing certain data points. At reference clock transitions $e_1$ and $c_1$, data is sampled and logically compared. If $e_1 \approx c_1$, then a transition (or phase change) has occurred in the data stream within a fraction of a data bit length. (Herein, a "data bit length" refers to the length of time for receiving one bit of data; e.g., in a data stream having a transmission rate of 1 Gb/sec, a data bit length is 1 ns.) As a result, phase detector 102 asserts an active do signal (e.g., a −1 value), and an appropriate adjustment is made to the RXDPHER signal to select a different phase of the PLL reference clock, thereby moving its phase closer to alignment with the data stream. This process may be repeated until the PLL reference clock and the incoming data stream are phase-aligned (i.e., the same transition occurs in each signal within an "alignment window," or period of time during which no difference in phase can be detected). Also, at reference clock transition $e_2$, the data is sampled and compared to the data value at reference clock transition $c_1$. If $c_1 \approx e_2$, then a transition has occurred in the data stream within about one data bit length, but between excursions in the data bits. As a result, phase detector 102 asserts an active up signal, and appropriate control signals are applied to the RXDPHER signal to select a different phase of the PLL reference clock, thereby moving its phase closer to alignment with the data stream. This process may also be repeated until the two clocks are phase-aligned. Ideally, there is no bias between up and dn assertions; i.e., the amount of time that up is asserted is roughly equal to the amount of time that dn is asserted.

Although phase adjustment circuit 104 includes a phase-frequency adjustment path 122, the term "phase-frequency" is more of a label than a completely accurate characterization of the circuit. For example, phase detector 102 only detects phase differences, and not frequency differences, between the PLL reference clock and the data stream. Furthermore, the logic that generates phase adjustment control signal up/dn can only determine whether a phase transition has occurred. This logic cannot provide any information about the frequency of the recovered clock RXCLK. Consequently, designers must assume and/or infer certain relationships between phase differences and frequency differences, and make different adjustments for perceived frequency differences. For example, phase-frequency adjustment path 122 includes an integrator 134, whereas phase adjustment path 120 does not. Also, the coefficients input into multipliers 130 and 132 typically differ from each other. The resultant output from phase-frequency adjustment path 122 is generally considered representative of a frequency offset between the transmission rate of incoming data and the recovered clock (or a multiplied and/or divided equivalent thereof).

However, this approach is not 100% effective for correcting frequency offsets in a clock signal recovered from a data stream. There is a potential error condition in the clock data recovery loop of FIG. 2 where the frequency offset between the reference clock and the incoming data stream is sufficiently large to cause the loop to diverge. In fact, under some conditions, a difference in the frequencies of the recovered clock signal and data stream will increase as the clock adjustment circuitry adjusts their phases into alignment.

As is known in the art, the data stream coming into the receiver 30 may be intermittent, and its rate may vary slightly from source to source. Occasionally, the rate from a single source may vary as well. Where the changes or disparities in transmission rates (or differences between the data transmission rate and the PLL frequency) lead to relatively large offsets in the phase of the recovered clock, the phase detector 102 and phase-frequency adjustment circuitry 104 will push the phase of the recovered clock in one direction in order to align it with the PLL. However, at sufficiently high offsets (e.g., about 1.5% or greater), the phase adjustment will actually change the frequency of the recovered clock in the direction away from convergence. In such a case, a runaway condition may result, leading to device failure and a need to reset the device. Therefore, a need exists to solve this potential failure mechanism.

As network speeds increase, the potential failure modes associated with clock data recovery make designing stable, flexible, adaptable and effective clock data recovery circuitry challenging. Thus, what is needed is an approach to high-speed clock data recovery designs that minimize or prevent the potential nonconvergence/clock runaway problem described above, preferably with minimal or no changes to existing designs and logic, and minimal additional circuitry to be added thereto.

SUMMARY OF THE INVENTION

Embodiments of the present invention relate to circuitry, architectures, systems and methods for clock data recovery from a data stream in a network. The circuitry generally comprises (a) a clock phase adjustment circuit, receiving clock phase information and providing a clock phase adjustment signal, (b) a clock frequency adjustment circuit, receiving clock frequency information and providing a clock frequency adjustment signal, and (c) an adder circuit, receiving the clock phase adjustment signal and the clock frequency adjustment signal, and providing a clock recovery adjustment signal. The architectures and/or systems generally comprise those that include a clock data recovery circuit embodying one or more of the inventive concepts disclosed herein. The method generally comprises the steps of (1) sampling the data stream at predetermined times, (2) generating clock frequency information and clock phase information from sampled data, and (3) altering a frequency and/or a phase of the clock signal in response to the clock frequency information and the clock phase information.

The present invention advantageously provides significantly greater coverage against one or more frequency-related failure modes associated with clock data recovery circuitry, particularly the nonconvergence/clock runaway problem described above. The present invention may also be used to improve existing designs and logic, with minimal or no changes. Thus, the present invention advantageously enables one to improve the reliability, stability and effectiveness of existing transceivers and networks, with a minimal amount of additional circuitry.

These and other advantages of the present invention will become readily apparent from the detailed description of preferred embodiments below.

DETAILED DESCRIPTION OF THE PREFERRED EMBODIMENTS

Figure 1:
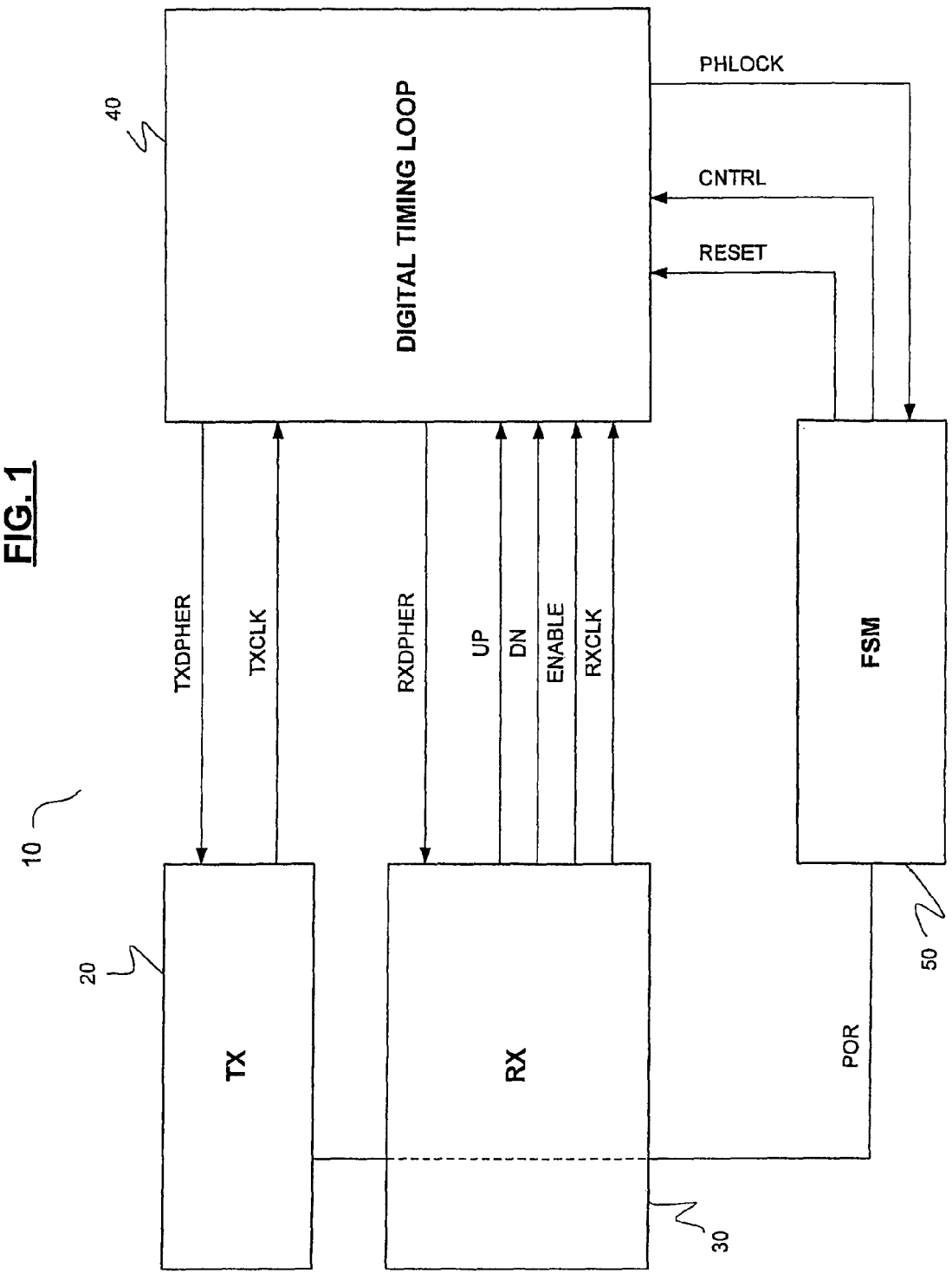
FIG. 1 is a box diagram showing a conventional architecture for a storage network physical layer device.
Figure 2:
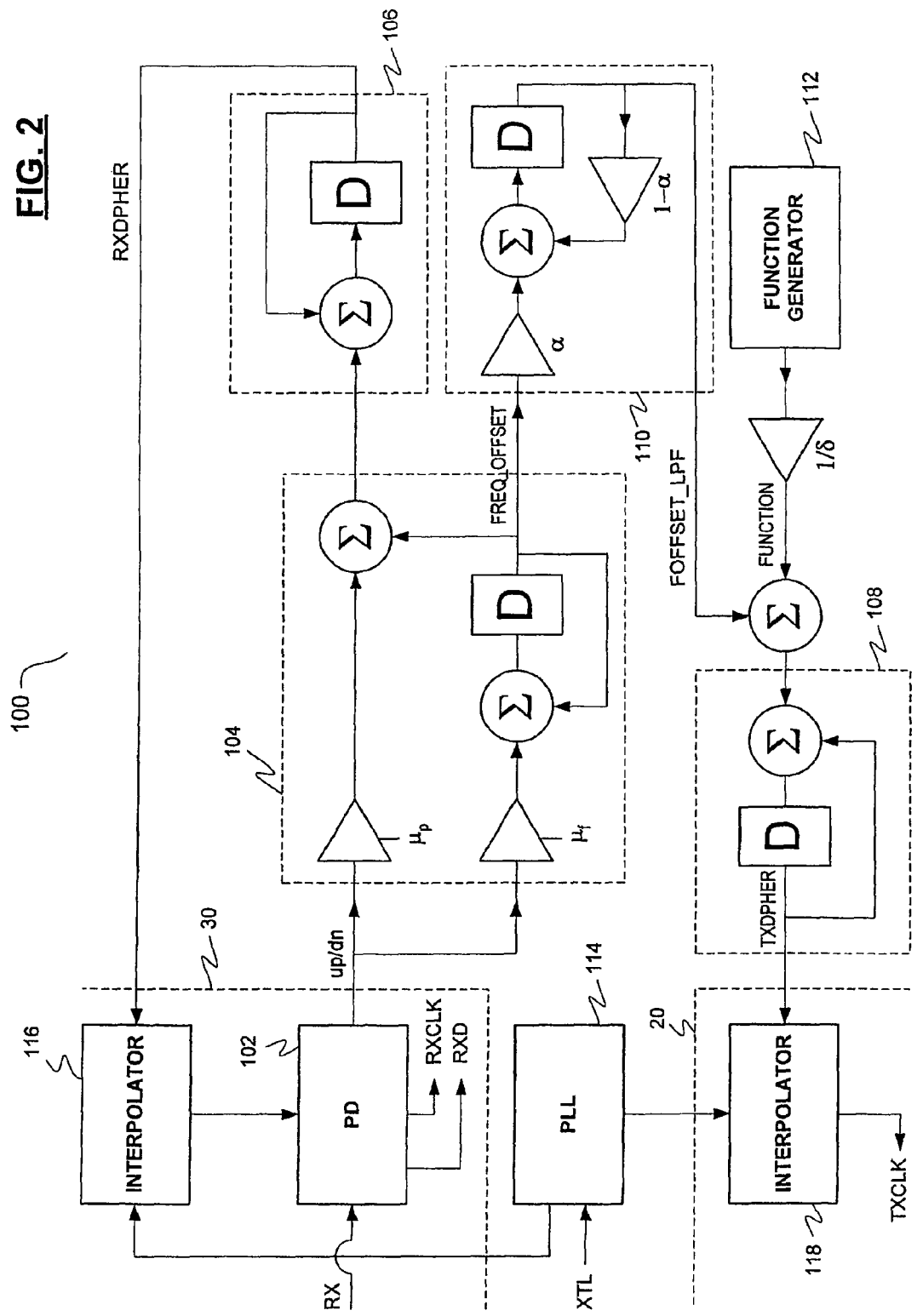
FIG. 2 is a diagram showing a conventional architecture and circuitry for clock data recovery in the physical layer device of FIG. 1.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with," but these terms are also generally given their art-recognized meanings.

The present invention concerns a circuit, architecture and system for clock data recovery. The clock recovery adjustment circuit generally comprises (a) a clock phase adjustment circuit, (b) a clock frequency adjustment circuit, and (c) an adder circuit. The clock phase adjustment circuit receives clock phase information and provides a clock phase adjustment signal. The clock frequency adjustment circuit receives clock frequency information and provides a clock frequency adjustment signal. The adder circuit receives the clock phase adjustment signal and the clock frequency adjustment signal, and provides a clock recovery adjustment signal. The clock recovery adjustment circuit generally adjusts a clock signal recovered from a data stream.

A further aspect of the invention concerns a clock data recovery circuit generally comprising (a) the present clock recovery adjustment circuit, and (b) a clock recovery circuit, configured to sample a data stream and provide (i) a recovered clock signal and (ii) the clock phase information and the clock frequency information from sampled data.

An even further aspect of the invention concerns a transceiver architecture, generally comprising the present clock data recovery circuit, a transmitter communicatively coupled to the clock data recovery circuit and configured to transmit serial data to a network, a receiver communicatively coupled to the clock data recovery circuit and configured to receive serial data from the network, and a PLL configured to provide a reference clock signal to the transmitter and the receiver. Further aspects of the invention concern systems and networks that include transceivers embodying the inventive concepts described herein.

Even further aspects of the invention concern methods of recovering a clock signal from a data stream and of adjusting such a recovered clock signal. The method of adjusting a clock signal generally comprises the steps of (a) sampling the data stream at predetermined times, (b) generating clock frequency information and clock phase information from sampled data, and (c) altering a frequency and/or a phase of the clock signal in response to the clock frequency information and the clock phase information. The method of recovering a clock signal from a data stream generally further comprises the steps of (i) receiving the data stream in a phase detector, and (ii) producing a recovered clock signal having its frequency and/or phase adjusted according to the present method of adjusting a clock signal.

The invention, in its various aspects, will be explained in greater detail below with regard to exemplary embodiments.

An Exemplary Phase-Frequency Adjustment Circuit

In one aspect, the present invention relates to a clock recovery adjustment circuit, comprising (a) a clock phase adjustment circuit, receiving clock phase information and providing a clock phase adjustment signal, (b) a clock frequency adjustment circuit, receiving clock frequency information and providing a clock frequency adjustment signal, and (c) an adder circuit, receiving the clock phase adjustment signal and the clock frequency adjustment signal, and providing a clock recovery adjustment signal. The clock recovery adjustment circuit is generally configured to adjust a clock signal recovered from a data stream.

Figure 4:
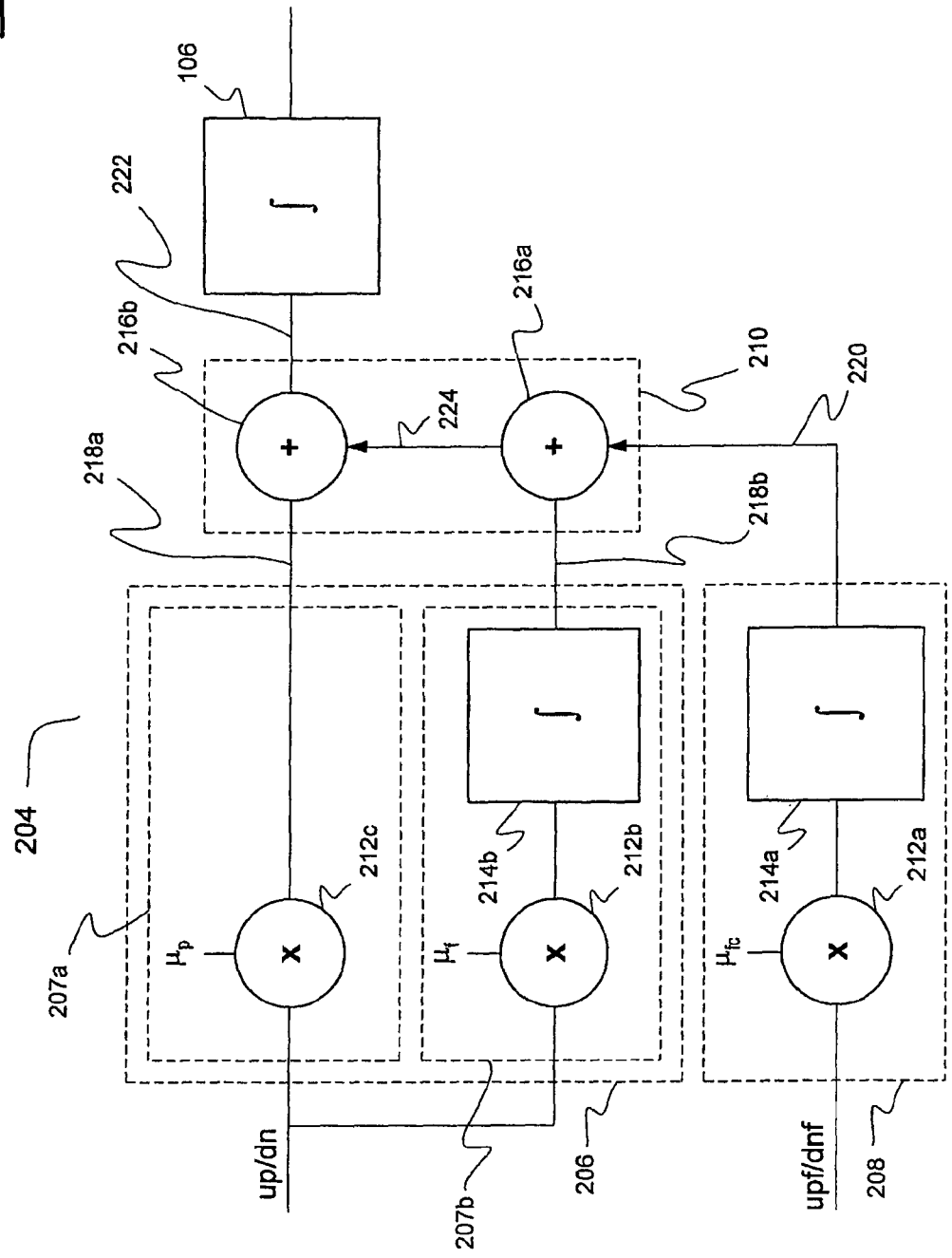
FIG. 4 is a diagram showing exemplary circuitry for adjusting a recovered clock implementing the present invention.

FIG. 4 shows a first exemplary embodiment, including clock phase adjustment circuit 206, clock frequency adjustment circuit 208, and adder circuit 210. Clock phase adjustment circuit 206 receives a phase error control signal up/dn from the receiver. As described above, up/dn signal is generated by logic in the receiver (preferably a phase detector) from clock phase information. Clock phase adjustment circuit 206 provides one or more clock phase adjustment signals, depending on the number of paths in and/or outputs from in 206. In the embodiment shown in FIG. 4, clock phase adjustment circuit 206 has two parallel paths and two clock phase adjustment outputs 218a and 218b. Clock frequency adjustment circuit 208 receives frequency error control signal upf/dnf from the receiver and provides a clock frequency adjustment signal 220. Adder circuit 210 receives the clock phase adjustment signal(s) and the clock frequency adjustment signal, and provides a clock recovery adjustment signal 222.

Frequency error control signal upf/dnf is generated from clock frequency information in receiver 30. Like phase error control signal up/dn, frequency error control signal upf/dnf is preferably a three-level signal having three states: +1 (upf asserted), −1 (dnf asserted), and 0 (neither upf nor dnf asserted). However, it is also contemplated that frequency error control signal upf/dnf may comprise a plurality of digital signals having the same logical outcome. Preferably, the clock frequency information is acquired and/or processed, and frequency error control signal upf/dnf is generated, by existing logic and circuitry in phase detector 102 in receiver 30, perhaps with a minimal amount of additional logic circuitry added to generate and/or provide frequency error control signal upf/dnf to clock frequency adjustment circuit 208. Thus, in one embodiment, the present clock recovery adjustment circuit further comprises logic configured to (i) sample the data stream at predetermined times and (ii) provide the clock frequency information and the clock phase information from sampled data.

Figure 5A:
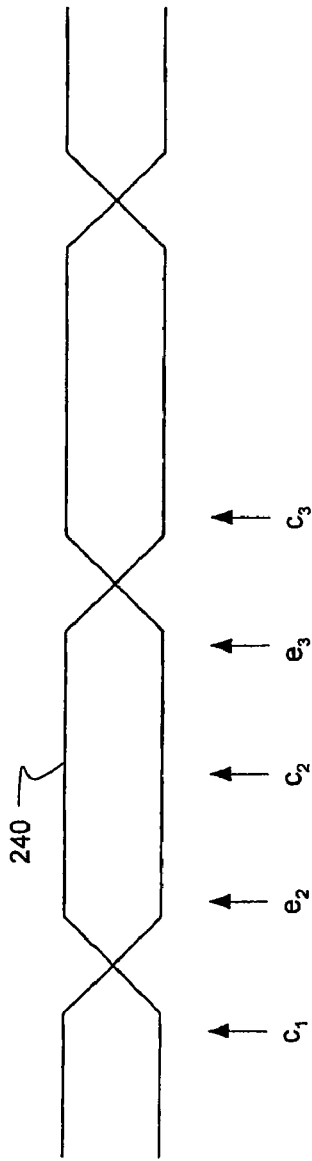
FIGS. 5A-5B each shows a data waveform and set of equations for the clock frequency adjustment circuitry of FIG. 4.
Figure 5B:
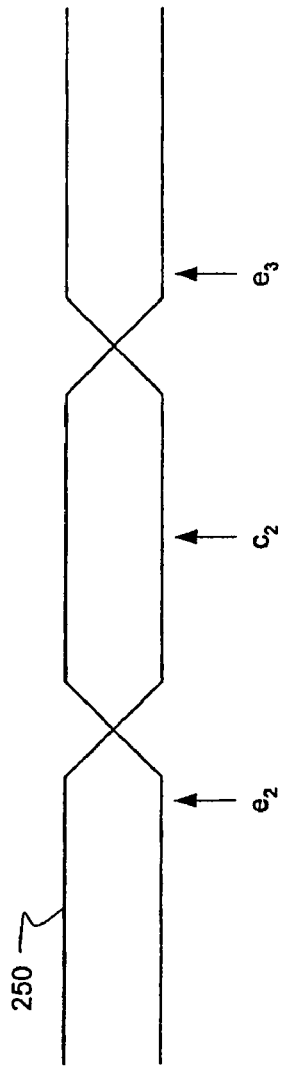

FIGS. 5A and 5B show timing diagrams and the logic used to generate frequency error control signal upf/dnf. As described above, the label symbols "$e_x$" and "$c_x$" respectively represent predefined phases of edge and center reference clocks derived from the PLL reference clock. The "c" and "e" reference clocks are configured to have a frequency that is an integer divisor of the received data stream transmission rate, and x represents the phases of each clock. In preferred embodiments, the integer divisor is $2^n$, where n is from 1 to 4, more preferably 2, and x is a variable integer having a maximum value the same as the integer divisor (see, e.g., CCLK1, ECLK1, CCLK2, ECLK2, CCLK3, ECLK3, CCLK4 and ECLK4 in FIG. 6). Furthermore, as explained above, the "e" reference clock phases are designed to transition generally at the same time as transitions in the data stream, and the "c" reference clock phases are designed to transition during excursions in individual data bits (see, e.g., the marked transitions of CCLK1, ECLK3 and ECLK4 in FIG. 6). It is well within the abilities of one skilled in the art of clock data recovery to design such reference clocks and use them in the manner described herein.

As shown in FIGS. 5A and 5B, the data stream is sampled at five points, using different phases of the "c" and "e" reference clocks. The sampled data is input into conventional logic gates that compare the data and compute a set of equations: Depending on the outcomes of the equations (as will be explained below), upf, dnf or neither is asserted.

FIG. 5A shows a condition in which the logic determines that the frequency of the recovered clock is too high. Herein, this is referred to as "an overshoot determination." At reference clock phases $c_1$, $e_2$, $c_2$, $e_3$ and $c_3$, the data 240 is sampled. The data values at phases $e_2$, $c_2$ and $e_3$ are compared, the data values at phases $c_1$ and $e_2$ are compared, and the data values at phases $e_3$ and $c_3$ are compared. If all of the following conditions are met: (1) the data values at phases $e_2$, $c_2$ and $e_3$ are all equal to each other; (2) the data values at phases $c_1$ and $e_2$ are not equal; and (3) the data values at phases $e_3$ and $c_3$ are not equal, then dnf is asserted, an appropriate adjustment is made, and the recovered clock frequency decreases.

Figure 6:
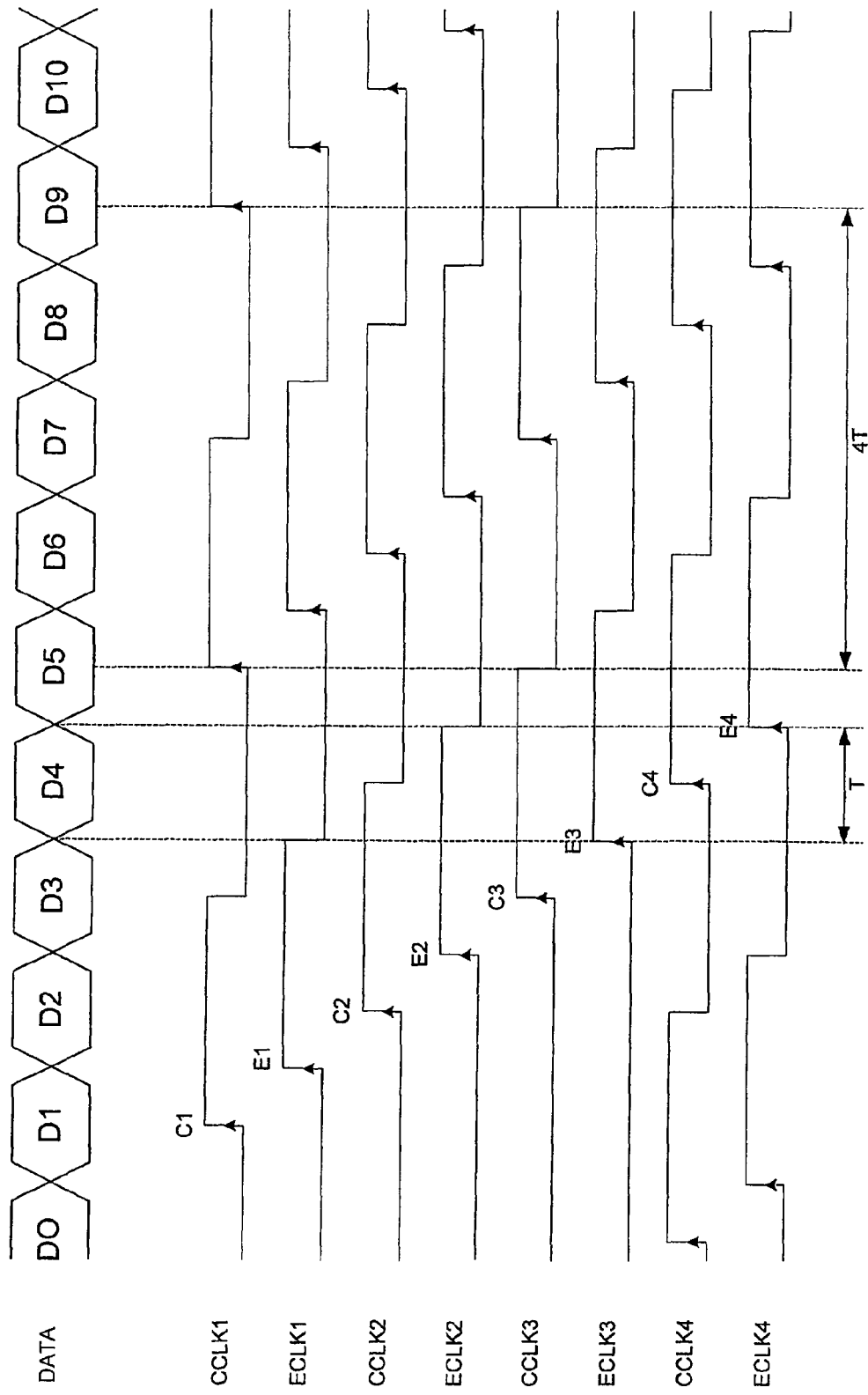
FIG. 6 is a set of waveforms illustrating an exemplary embodiment of clock phases for sampling data according to the present invention.

Referring now to FIG. 6, in this embodiment, consecutive "$e_x$" reference clock phases (e.g., see the marked transitions of ECLK3 and ECLK4) are configured to correspond to one data bit length T. Referring back to FIG. 5, one can see that the recovered clock (which is or is generated from the phase-locked or phase-adjusted PLL reference clock, and therefore has a frequency corresponding or related to "$e_x$" reference clock phases) has a period (or known fraction thereof) that is short relative to a data bit length (e.g., compare phases $e_2$ and $e_3$ with the data bit length). A clock period is the inverse of the clock frequency. Therefore, when the clock period is too short relative to the signal to which it is desired to lock, the clock frequency is too high, and the clock frequency should be decreased to lock the clock to the desired signal. By also determining whether data transitions have occurred before phase $e_2$ (i.e., $c_1 \neq e_2$) and after phase $e_3$ (i.e., $e_3 \neq c_3$), one can conclusively determine that the recovered clock frequency is too high relative to the incoming data stream.

FIG. 5B shows a condition in which the logic determines that the frequency of the recovered clock is too low. Herein, this is referred to as "an undershoot determination." The sampled values of data stream 250 at phases $e_2$ and $c_2$ are compared, and the sampled data values at phases $c_2$ and $e_3$ are compared. If (1) the data values at phases $e_2$ and $c_2$ are not equal to each other, and (2) the data values at phases $c_2$ and $e_3$ are not equal to each other, then upf is asserted, an appropriate adjustment is made, and the recovered clock frequency increases. In this case, the logic is a little easier. By simply determining that two data transitions have occurred (e.g., $e_2 \neq c_2$ and $c_2 \neq e_3$) within successive "$e_x$" reference clock phases (e.g., $e_2$ and $e_3$), one can conclusively determine that the recovered clock frequency is too low relative to the incoming data stream.

Therefore, in certain embodiments, the clock frequency information in the present clock recovery adjustment circuit comprises (i) an undershoot determination and (ii) an overshoot determination relative to a data bit length. Furthermore, the logic providing the clock frequency information may be configured to receive a plurality of predetermined phases of a reference clock signal locked to and/or corresponding to the recovered clock signal.

It is well within the abilities of one skilled in the art of clock data recovery and/or logic design to design and use logic configured to sample data and provide the clock frequency and phase information in the manner described herein. However, in preferred embodiments, the logic configured to sample the data stream comprises a set of parallel latches configured to latch a data bit value at successive intervals of the multi-phase reference clock(s) described above. Furthermore, the logic configured to provide clock frequency information preferably comprises first logic configured to determine whether the equation $e_2=c_2=e_3$ is true or false, second logic configured to determine whether the equation $c_1 \neq e_2$ is true or false, third logic configured to determine whether the equation $e_3 \neq c_3$ is true or false, fourth logic configured to determine whether the equation $e_2 \neq c_2$ is true or false, fifth logic configured to determine whether the equation $c_2 \neq e_3$ is true or false, sixth logic configured to determine whether each of the first logic, second logic and third logic determine true outcomes, and seventh logic configured to determine whether each of the fourth logic and fifth logic determine true outcomes. Preferably, such logic comprises conventional binary logic gates.

Referring back to FIG. 4, the clock frequency adjustment circuit 208 includes a multiplier 212a receiving the upf/dnf signal and, in series, an integrator 214a, which provides clock frequency adjustment signal 220 to adder circuit 210. Multiplier 212a also receives a frequency adjustment coefficient $\mu_{fc}$, which is generally implemented as one or more bias signals or voltages applied to multiplier 212a in accordance with conventional techniques. Integrator 214a can be any conventional integrator.

FIG. 4 also shows a similar structure for the two paths or legs of clock phase adjustment circuit 206, which includes parallel first and second clock phase adjustment paths 207a and 207b configured to receive the clock phase adjustment control signal up/dn. A first clock phase adjustment path 207a includes a multiplier 212c and provides a first clock phase adjustment signal 218a. The second clock phase adjustment path 207b includes a multiplier 212b and an integrator 214b, and provides a second clock phase adjustment signal 218b. Multipliers 212c and 212b respectively receive first and second phase adjustment coefficients $\mu_p$ and $\mu_{fi}$ which are generally implemented similarly to frequency adjustment coefficient $\mu_{fc}$, but which are generally generated independently from each other and from frequency adjustment coefficient $\mu_{fc}$.

Generally, any number of clock phase adjustment paths may be included in the present clock recovery adjustment circuit. For example, a single clock phase adjustment path may be implemented, and such a path can have the structure and/or configuration of either first clock phase adjustment path 207a or second clock phase adjustment path 207b. More than two parallel clock phase adjustment paths may be included in the present clock recovery adjustment circuit (e.g., to improve or refine the resolution of the clock recovery adjustment signal), but at this time, such an implementation is less preferred.

Figure 7A:
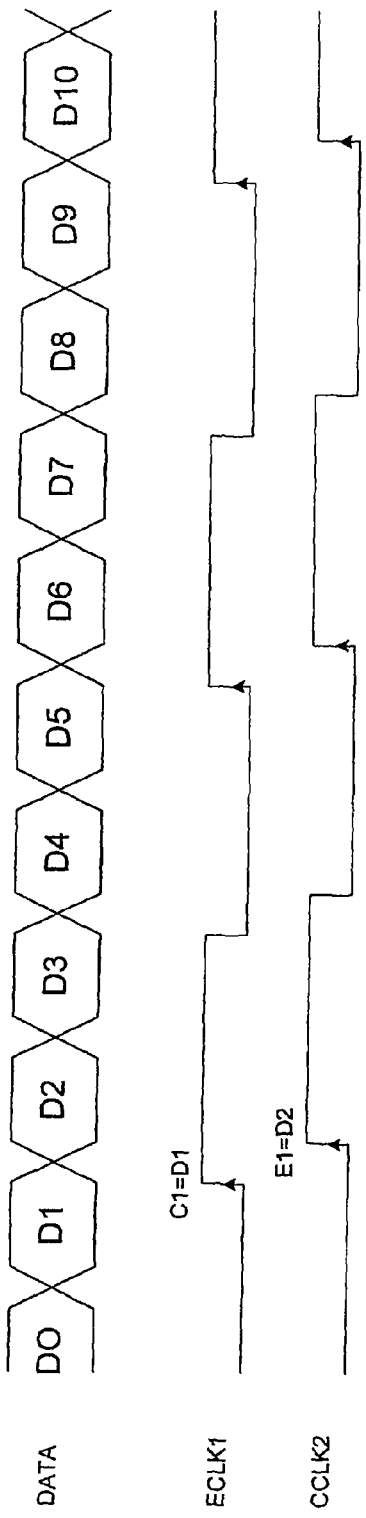
FIGS. 7A-B each show a set of waveforms illustrating examples of early and late recovered clock phases according to the present invention.
Figure 7B:
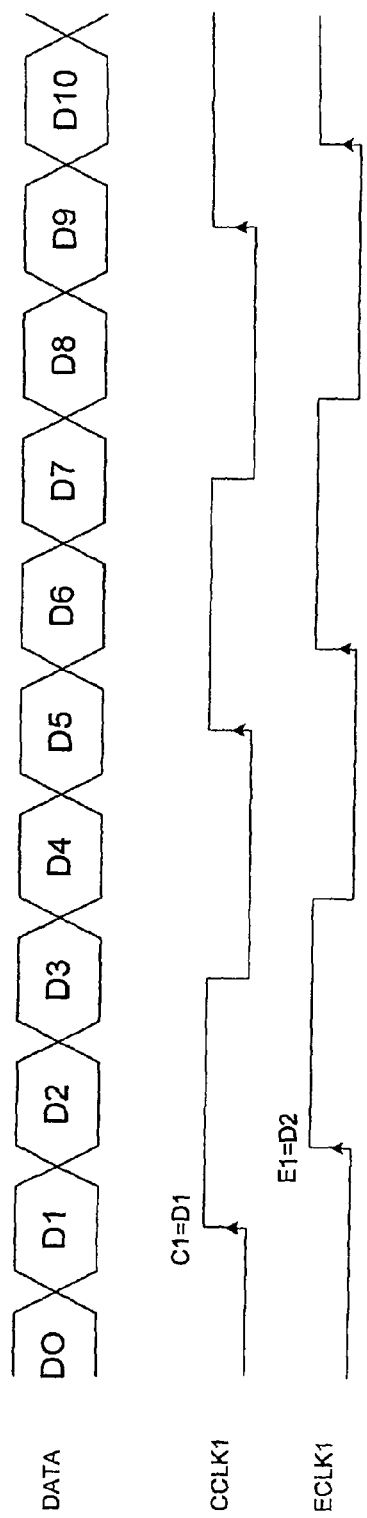

In further embodiments of the present clock recovery adjustment circuit, the clock phase information may comprise, relative to a data transition of the data stream, (i) an early clock phase determination and (ii) a late clock phase determination. Referring now to FIGS. 7A-7B, sets of waveforms and logic are shown that respectively illustrate an early clock phase determination and a late clock phase determination.

Three waveforms are shown in FIG. 7A: data, ECLK1 and CCLK2. As shown in FIG. 6, ECLK1 is configured to latch data at about the transition between the first and second data bits following a predetermined initial data bit (designated D0), and CCLK2 is configured to latch data during the second data bit. If D1$\neq$D2, then $e_1 \neq c_2$ and there has been a data transition between these reference clock phases at or before the expected time. This is an example of an early clock phase determination.

On the other hand, the three waveforms shown in FIG. 7B are data, CCLK1 and ECLK1. As shown in FIG. 6, CCLK1 is configured to latch data during the first second data bit following the initial data bit. In this case, ECLK1 latches data after the transition between the first and second data bits. If, in this case, D1$\neq$D2, then $c_1 \neq e_1$ and there has been a data transition between these reference clock phases after the expected time. This is an example of a late clock phase determination.

Figure 3A:
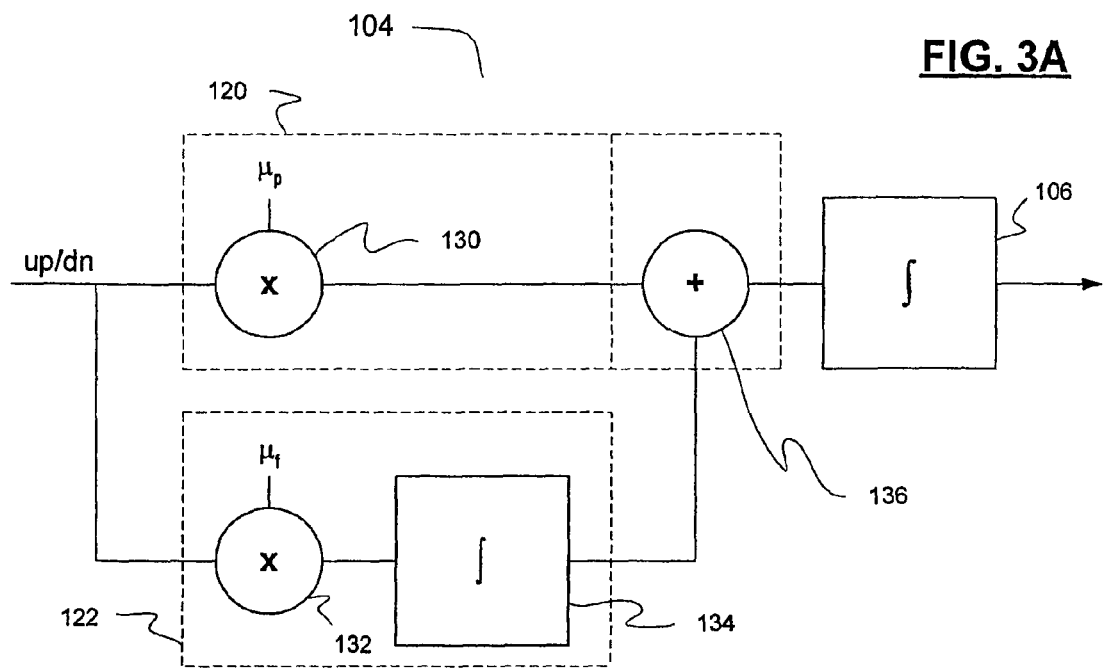
FIG. 3A is a diagram showing conventional phase adjusting circuitry for the clock data recovery architecture and circuitry of FIG. 2.
Figure 3B:
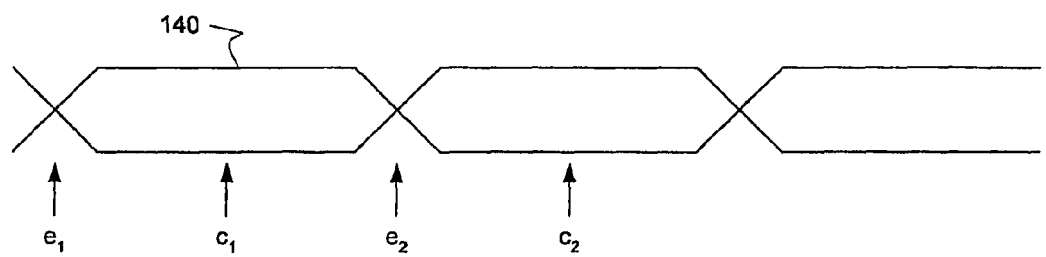
FIG. 3B shows a data waveform and set of equations for the clock phase adjustment circuitry of FIG. 3A.

These are not the only reference clock phases that can be used for such phase determinations. For example, in the embodiment of FIG. 3B, CCLK1 and CCLK2 are used for a late clock phase determination. However, it is preferred that at least one of the clock phase determinations use data from successive phases of the reference clocks taken as a whole (e.g., $c_x$ and $e_x$, or $e_x$ and $c_{x+1}$), and that at least one other clock phase determinations use data from successive phases of the reference clocks taken as a whole or individually (e.g., $c_x$ and $c_{x+1}$, or $e_x$ and $e_{x+1}$).

Referring back to FIG. 4, the adder circuit comprises a first adder 216a and a second adder 216b. Adder 216a is configured to (i) add clock frequency adjustment signal 220 and clock phase adjustment signal 218b, and (ii) provide a first adder output signal 224. Adder 216b is configured to (i) add first adder output 224 and clock phase adjustment signal 218a, and (ii) provide clock recovery adjustment signal 222. Integrator 106 (which is an optional part of the present clock recovery adjustment circuit) may also provide a clock recovery adjustment signal, when included.

An Exemplary Clock Data Recovery Architecture

Figure 8:
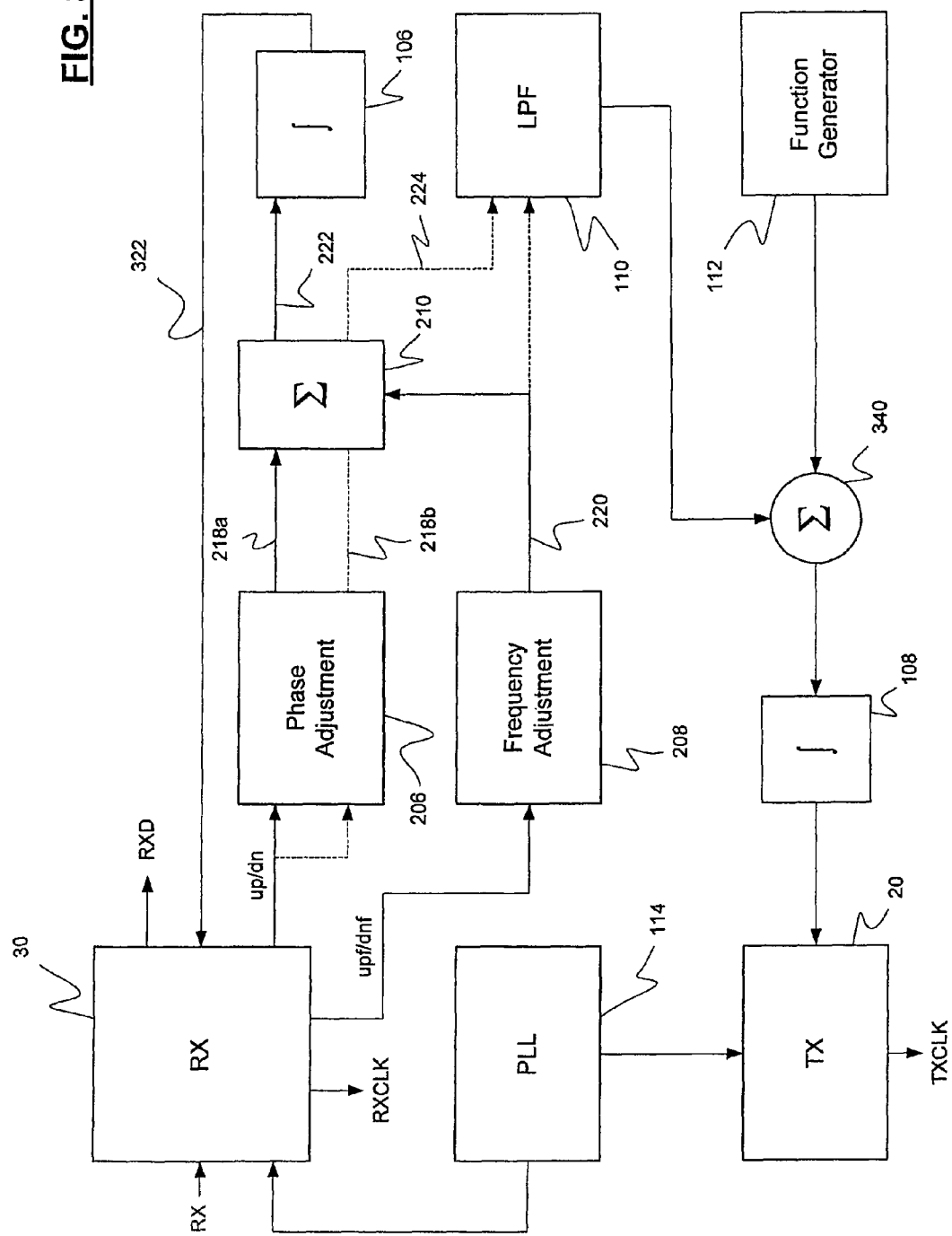
FIG. 8 is a box diagram showing an exemplary architecture for clock data recovery, embodying the present invention.

In another aspect, the present invention concerns a clock data recovery architecture that includes circuitry for adjusting both the phase and the frequency of the recovered clock, such as the exemplary circuitry 210 of FIG. 4A. Referring now to FIG. 8, the clock data recovery circuit generally includes a clock phase adjustment circuit 206 configured to receive clock phase information and adjust a recovered clock phase, a clock frequency adjustment circuit 208 configured to receive clock frequency information and adjust a recovered clock frequency, an adder circuit 210 coupled to the outputs of the clock phase adjustment circuit and the clock frequency adjustment circuit, configured to provide a clock recovery adjustment signal 222, and a clock recovery circuit, configured to sample a data stream and provide (i) a recovered clock signal RXCLK and (ii) the clock phase information and the clock frequency information from sampled data.

In a preferred embodiment, the clock recovery circuit comprises a plurality of latches configured to sample the data stream at predetermined times, similar to the logic described above for sampling the data stream. Furthermore, the predetermined times may be at regular time intervals corresponding to an integer fraction of the PLL reference signal period. As described above, the integer fraction is preferably ($\frac{1}{2^n}$), where n is at least 1, preferably from 2 to 7. In one implementation, n is 3. In that implementation, the recovered clock signal and the PLL clock signal have a frequency of about one-fourth the data transmission rate, but the reference clock is split into eight equally-spaced phases to correspond to the predetermined times for sampling data.

Similar to the present clock recovery adjustment circuit, the present clock data recovery circuit may further comprise a plurality of logic gates configured to generate the clock phase information and the clock frequency information from sampled data. In addition, the clock data recovery circuit may further comprise a phase locked loop 114 configured to generate a reference clock signal for (i) locking the recovered clock signal and/or (ii) generating the clock phase and frequency information.

In further embodiments, the present clock data recovery circuit may further comprise one or more integrators 106, which may be configured to (i) receive an analog clock recovery adjustment signal from adder 206 (or, in the alternative, the present clock recovery adjustment circuit) and/or (ii) provide a multi-bit and/or digital clock recovery adjustment signal RXDPHER to the receiver 30 for adjusting the recovered clock signal RXCLK. In a preferred embodiment, the clock recovery adjustment signal RXDPHER provided by the clock data recovery circuit integrator 106 is multi-bit and digital, and even more preferably, the width of this multi-bit, digital signal is p bits, where the number of reference clock phases from which the receiver interpolator (or reference clock selection circuit) may select is $2^p$. In one implementation, this multi-bit, digital clock recovery adjustment signal is 7 bits wide (i.e., p=7).

In the present clock data recovery circuit, the primary clock phase adjustment circuit output is signal 218a (e.g., from the first clock phase adjustment path 207a of FIG. 4). However, the clock phase adjustment circuit output may further comprise signal 218b (e.g., from the second clock phase adjustment path 207b of FIG. 4). In the latter case, low pass filter 110 may receive a clock phase-frequency adjustment signal 224 from adder circuit 210 (e.g., from adder 216a), clock frequency adjustment signal 220, or both (in which case low pass filter 110 may further comprise an adder configured to add and clock phase-frequency adjustment signal 224 and clock frequency adjustment signal 220). Preferably, low pass filter 110 receives clock phase-frequency adjustment signal 224 from adder circuit 210.

The present clock data recovery circuit may also further comprise a transmitter clock adjustment circuit configured to provide a transmitter clock adjustment signal (e.g., TXDPHER in FIG. 8) to the transmitter 20 for adjusting the transmitter clock signal TXCLK. In preferred embodiments, the transmitter clock adjustment circuit may comprise (1) a low pass filter 110, (2) a function generator 112 and adder 340, and/or (3) an integrator 108. In one implementation, the function generator is a spread spectrum generator, which may add a triangular waveform to the transmitter clock adjustment signal TXDPHER to reduce electromagnetic interference (EMI) from the transmitter. Similar to the clock recovery adjustment signal RXDPHER, transmitter clock adjustment signal TXDPHER may be multi-bit and/or digital, and preferably is multi-bit and digital with a width of p bits, where the number of reference clock phases from which the transmitter interpolator (or reference clock selection circuit) may select is $2^p$. In one implementation, this multi-bit, digital transmitter clock adjustment signal is 7 bits wide (i.e., p=7).

An Exemplary Transceiver

A further aspect of the invention relates to a transceiver that includes circuitry for adjusting both the phase and the frequency of the recovered clock, such as the exemplary circuitry 210 of FIG. 4A. The transceiver generally includes a clock phase adjustment circuit configured to receive clock phase information and adjust a recovered clock phase; a clock frequency adjustment circuit configured to receive clock frequency information and adjust a recovered clock frequency; an adder circuit 210 coupled to the outputs of the clock phase adjustment circuit and the clock frequency adjustment circuit, configured to provide a clock recovery adjustment signal; a clock recovery circuit, configured to sample a data stream and provide (i) a recovered clock signal and (ii) the clock phase information and the clock frequency information from sampled data; a receiver communicatively coupled to the clock data recovery circuit, configured to receive serial data from the network; and a transmitter communicatively coupled to the clock data recovery circuit, configured to transmit serial data to a network. Optionally, the transceiver may further comprise a PLL configured to provide a reference clock signal to the transmitter and the receiver. Preferably, the transceiver is embodied on a single integrated circuit.

In further embodiments, the transceiver further comprises (i) a function generator, which in one implementation, comprises a spread spectrum wave generator as described above; (ii) a finite state machine, configured to reset the receiver, transmitter and/or clock recovery circuitry; and/or (ii) a configuration block configured to store and provide configuration information (e.g., one or more of the multiplier coefficients, a drive strength and/or impedance for output buffers, PLL parameters such as frequency multiplier and/or divider values, a number of reference clock phases for the interpolators, spread spectrum wave function values, etc.) for the transceiver.

The System and Network

In a further aspect of the invention, the system comprises the present transceiver, at least one transmitter port communicatively coupled to the transmitter for transmitting serial data to an external receiver, and at least one receiver port communicatively coupled to the receiver for receiving the data stream. The system is generally configured to transfer data between a coupled communications or storage device and other such devices across a network.

In a preferred embodiment, the data stream is a serial data stream, the communications or storage device is a storage device, and/or the system is part of a storage network.

In further embodiments, the system may be configured to convert serial data from the network to parallel data for a storage device, and convert parallel data from the storage device to serial data for the network. Furthermore, the system may further include (1) one or more converters configured to convert the serial data stream into parallel data; and/or (2) a storage device coupled to the transceiver, configured to receive the parallel data stream. In preferred embodiments, the storage device comprises a conventional magnetic and/or optical data storage device (e.g., hard disk drive, CD-ROM and CD-ROM drive, etc.)

A further aspect of the invention concerns a network, comprising (a) a plurality of the present systems, communicatively coupled to each other; and (b) a plurality of storage or communications devices, wherein each storage or communications device is communicatively coupled to one of the systems. The network may be any kind of known network, such as a storage network (e.g., RAID array), Ethernet, or wireless network, but preferably, the network comprises a storage network.

The network may include any known storage or communications device, but preferably, at least a plurality of the coupled devices comprise storage devices.

Exemplary Methods of Adjusting a Recovered Clock and of Clock Data Recovery

The present invention further relates to methods of recovering a clock signal from a data stream and of adjusting such a recovered clock signal. The method of adjusting a clock signal recovered from a data stream generally comprises the steps of (a) sampling the data stream at predetermined times, (b) generating clock frequency information and clock phase information from sampled data, and (c) altering a frequency and/or a phase of the clock signal in response to the clock frequency information and the clock phase information.

In a further embodiment, the sampling step may comprise latching the data stream at predetermined intervals. Preferably, the predetermined intervals are less than two data bit lengths, more preferably less than one and one-half data bit lengths, and most preferably about one data bit length or less. Furthermore, latching may be performed in response to a phase of a reference clock, where the reference clock may be configured to have (i) $2^q$ equally-spaced phases and (ii) a frequency of $(\frac{1}{2}^{q-1})$ times the transmission rate of the data stream.

In a further embodiment, the step of generating clock frequency and phase information may comprise logically comparing data sampled at two or more successive phases of the reference clock continuously, periodically or conditionally. In a specific implementation, generating clock frequency information may comprise logically comparing data sampled at (i) first and second successive reference clock phases, (ii) second, third and fourth successive reference clock phases, and (iii) fourth and fifth successive reference clock phases. In a further implementation, generating clock frequency information further comprises logically comparing data sampled at (i) first and second successive reference clock phases, and (ii) second and third successive reference clock phases. Preferably, the two implementations are combined, in which case data is sampled at (i) first and second, (ii) second and third, (iii) second, third and fourth, (iv) third and fourth, and (v) fourth and fifth successive reference clock phases.

In other specific implementations, generating clock phase information may comprise logically comparing data sampled at (i) first and second successive reference clock phases and/or (ii) first and third reference clock phases, the third reference clock phase being two successive clock phases after the first reference clock phase. Preferably, these two implementations are also combined, in which case data is sampled at (i) first and second successive reference clock phases and (ii) second and fourth reference clock phases, the fourth reference clock phase being two successive clock phases after the second reference clock phase.

The logical comparisons may be performed periodically, e.g., every x cycles of the reference clock, where x is an integer of at least 8, preferably at least 16, more preferably at least 32. It is well within the abilities of one skilled in the art to design circuitry and/or logic for periodic sampling, but such periodic sampling would generally be activated by a conventional counter configured to count reference clock cycles and turn on switches in the sampling latches when the count target is reached. Conditional sampling may be dependant upon one or more conditions in the receiver, transceiver and/or network being met, such as the recovered clock and reference clock being out of phase alignment by at least a threshold value (e.g., at least 0.5%, at least 50 ps, etc.). It is also well within the abilities of one skilled in the art to design circuitry and/or logic for conditional sampling.

One object of the method is to phase lock the PLL reference clock signal (and thus, the recovered clock signal) to an incoming data stream. Therefore, in other embodiments, the method may further comprise (i) selecting a reference clock phase to provide to a phase detector receiving the data stream, or (ii) increasing or decreasing a voltage or current to the oscillator (e.g., PLL) providing the reference clock signal. In other embodiments, the method may further comprise adjusting (and preferably multiplying) the clock frequency information by a frequency adjustment coefficient and/or the clock phase information by a phase adjustment coefficient and/or a phase-frequency adjustment coefficient.

In the aspect of the present method involving recovering the clock signal from a data stream, the method generally comprises the steps of receiving a data stream in a phase detector, sampling the data stream at predetermined times, generating clock frequency information and clock phase information from sampled data, and altering a frequency and/or phase of the clock signal in response to the clock frequency information and the clock phase information. This method may further comprise the steps of (i) providing the (recovered) clock signal, (ii) providing the data stream from the phase detector (e.g., to a downstream converter or an attached storage or communications device), (iii) repeating the sampling, generating and altering steps until the clock signal is phase locked to a reference clock signal, and/or (iv) adjusting a frequency and/or phase of a second clock signal (e.g., the transmitter clock) in response to at least the clock frequency information and/or the clock phase information. Preferably, the method of recovering the clock signal from a data stream further comprises the steps of (1) providing the recovered clock signal, and (2) repeating the sampling, generating and altering steps until the recovered clock signal is phase locked to a reference clock signal.

CONCLUSION/SUMMARY

Thus, the present invention provides a simple and efficient circuit, architecture, system and method for clock data recovery. The present circuit, architecture, system and method greatly improve the stability, reliability and effectiveness of receivers, transceivers, and networks that process serial data. The present invention advantageously improves existing circuits and systems with minimal or no changes thereto, and with a minimum of additional circuitry and/or processing steps.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A clock recovery adjustment circuit, comprising:

a clock phase adjustment circuit configured to receive clock phase information and provide a clock phase adjustment signal, said clock phase adjustment circuit comprising a first multiplier configured to receive said clock phase information and a clock phase adjustment coefficient;

a clock frequency adjustment circuit comprising a second multiplier and a first integrator, said second multiplier configured to receive a frequency adjustment coefficient, said clock frequency adjustment circuit configured to receive clock frequency information and provide a clock frequency adjustment signal, wherein said clock frequency information comprises, relative to a bit length of a data stream, a frequency undershoot determination and a frequency overshoot determination;

logic configured to
sample said data stream at predetermined intervals,
provide said clock frequency information and said clock phase information from sampled data and predetermined phases of one or more reference clock signals, compare data bit values at first and second phases of said reference clock signal, and at third and fourth phases of said reference clock signal; and provide said frequency overshoot determination when (i) the data bit values at said first and second sampled phases of said reference clock signal are not equal, (ii) the data bit values at said third and fourth sampled phases of said reference clock signal are not equal, and (iii) the data bit values of said second and third sampled phases are equal; and an adder circuit configured to receive said clock phase adjustment signal and said clock frequency adjustment signal, and provide a clock recovery adjustment signal.

2. The clock recovery adjustment circuit of claim 1, wherein said second multiplier receives said clock frequency information.

3. The clock recovery adjustment circuit of claim 2, wherein said second multiplier and said first integrator are in series.

4. The clock recovery adjustment circuit of claim 1, wherein said clock phase information comprises (i) an early clock phase determination and (ii) a late clock phase determination relative to a data transition of said data stream.

5. The clock recovery adjustment circuit of claim 1, wherein said logic is configured to receive said predetermined phases of said one or more reference clock signals.

6. The clock recovery adjustment circuit of claim 1, wherein:

said clock phase adjustment circuit comprises parallel first and second clock phase adjustment paths configured to receive said clock phase information, said first clock phase adjustment path (i) comprises said first multiplier and (ii) provides a first clock phase adjustment path signal, and said second clock phase adjustment path (i) comprises a third multiplier and a second integrator and (ii) provides a second clock phase adjustment path signal.

7. The clock recovery adjustment circuit of claim 6, wherein said adder circuit comprises a first adder and a second adder.

8. The clock recovery adjustment circuit of claim 7, wherein said first adder is configured to (i) add said clock frequency adjustment signal and said second clock phase adjustment path signal, and (ii) provide a first adder output.

9. The clock recovery adjustment circuit of claim 8, wherein said second adder is configured to (i) add said first adder output and said first clock phase adjustment path signal, and (ii) provide said clock recovery adjustment signal.

10. A clock data recovery circuit, comprising:

the clock recovery adjustment circuit of claim 1;

a clock recovery circuit, configured to sample said data stream and provide (i) a recovered clock signal and (ii) said clock phase information and said clock frequency information from sampled data.

11. The clock data recovery circuit of claim 10, wherein said clock recovery circuit comprises a plurality of latches configured to sample said data stream at said predetermined intervals.

12. The clock data recovery circuit of claim 11, wherein said predetermined intervals correspond to an integer fraction of said recovered clock signal.

13. The clock data recovery circuit of claim 10, wherein said clock recovery circuit further comprises a plurality of logic gates configured to generate said clock phase information and said clock frequency information from the sampled data.

14. A transceiver, comprising:

the clock recovery adjustment circuit of claim 1;

a transmitter communicatively coupled to said clock data recovery circuit, configured to transmit serial data to a network; and a receiver communicatively coupled to said clock data recovery circuit, configured to receive serial data from said network.

15. The clock recovery adjustment circuit of claim 1, wherein said logic is further configured to:

compare data bit values at said first sampled phase, said fourth sampled phase and a fifth sampled phase of said reference clock signal; and provide said frequency undershoot determination when:

the data bit values at said second and fifth sampled phases of said reference clock signal are not equal, and the data bit values at said third and fifth sampled phases of said reference clock signal are not equal; wherein said frequency overshoot determination is provided when the data bit values of said second and third sampled phases are also equal to the fifth sampled phase.

16. A method of adjusting a clock signal recovered from a data stream, the method comprising the steps of:

sampling said data stream by latching said data stream in a latch at predetermined intervals of about one data bit length or less;

generating clock phase information from sampled data;

generating clock frequency information by logically comparing sampled data at two or more successive phases of at least a first reference clock with data sampled at one or more successive phases of first and second reference clocks;

altering a frequency and/or phase of said clock signal recovered from said data stream in response to said clock frequency information and said clock phase information using logic circuitry, said logic circuitry comprising a clock phase adjustment circuit comprising a first multiplier configured to receive said clock phase information and a phase adjustment coefficient, and a clock frequency adjustment circuit comprising a second multiplier, said clock frequency adjustment circuit configured to receive said clock frequency information and said second multiplier configured to receive a frequency adjustment coefficient.

17. The method of claim 16, wherein generating said clock phase information comprises logically comparing said sampled data with said data sampled at said one or more successive phases of said second reference clock.

18. The method of claim 16, further comprising repeating said method until said clock signal is phase locked to a reference clock signal.

19. The method of claim 16, further comprising, after said altering step, selecting a reference clock phase to provide to a phase detector receiving the data stream.

20. The method of claim 16, further comprising adjusting said clock frequency information by said frequency adjustment coefficient.

21. A clock recovery adjustment circuit, comprising:

a clock phase adjustment circuit configured to receive clock phase information and provide a clock phase adjustment signal, said clock phase adjustment circuit comprising a first multiplier configured to receive said clock phase information and a clock phase adjustment coefficient;

a clock frequency adjustment circuit comprising a second multiplier and a first integrator, said second multiplier configured to receive a frequency adjustment coefficient, said clock frequency adjustment circuit configured to receive clock frequency information and provide a clock frequency adjustment signal, wherein said clock frequency information comprises, relative to a bit length of a data stream, a frequency undershoot determination and a frequency overshoot determination;

logic configured to
- sample said data stream at predetermined intervals of about one data bit length or less,
- generate said clock phase information from sampled data,
- generate said clock frequency information by comparing data sampled at two or more successive phases of a reference clock, and
- provide said clock frequency information and said clock phase information;

an adder circuit configured to
- receive said clock phase adjustment signal and said clock frequency adjustment signal, and
- provide a clock recovery adjustment signal configured to alter a frequency and/or phase of said clock signal recovered from said data stream, a clock recovery circuit comprising a plurality of latches configured to sample said data stream at said predetermined intervals, said clock recovery circuit being configured to provide a recovered clock signal, said clock phase information, and said clock frequency information from sampled data and a transmitter clock adjustment circuit configured to provide a transmitter clock adjustment signal to a transmitter for adjusting a transmitter clock signal, said transmitter clock adjustment circuit comprising (i) a low pass filter, (ii) a spread spectrum generator, (iii) an adder, and/or (iv) an integrator.

22. The clock recovery adjustment circuit of claim 21, wherein said second multiplier and said first integrator are in series.

23. The clock recovery adjustment circuit of claim 21, wherein said clock phase information comprises (i) an early clock phase determination and (ii) a late clock phase determination, relative to a data transition of said data stream.

24. The clock recovery adjustment circuit of claim 21, wherein said logic is configured to receive said predetermined phases of said reference clock signal.

25. The clock recovery adjustment circuit of claim 21, wherein:
- said clock phase adjustment circuit comprises parallel first and second clock phase adjustment paths configured to receive said clock phase information,
- said first clock phase adjustment path (i) comprises said first multiplier and (ii) provides a first clock phase adjustment path signal, and
- said second clock phase adjustment path (i) comprises a second multiplier and a second integrator and (ii) provides a second clock phase adjustment path signal.

26. The clock recovery adjustment circuit of claim 25, wherein said adder circuit comprises a first adder and a second adder.

27. The clock recovery adjustment circuit of claim 26, wherein said first adder is configured to (i) add said clock frequency adjustment signal and said second clock phase adjustment path signal, and (ii) provide a first adder output.

28. The clock recovery adjustment circuit of claim 27, wherein said second adder is configured to (i) add said first adder output and said first clock phase adjustment path signal, and (ii) provide said clock recovery adjustment signal.

29. The clock recovery adjustment circuit of claim 21, wherein said latches are configured in a parallel arrangement.

30. A transceiver, comprising:
- the clock recovery adjustment circuit of claim 21;
- a transmitter communicatively coupled to said clock recovery adjustment circuit, configured to transmit serial data to a network; and
- a receiver communicatively coupled to said clock recovery circuit, configured to receive serial data from said network.

31. The transceiver of claim 30, further comprising a converter, configured to convert said serial data into parallel data.

32. The transceiver of claim 31, further comprising a storage device coupled to said transceiver, configured to receive said parallel data stream.

* * * * *